United States Patent [19]

Daniels

[11] Patent Number: 4,995,165
[45] Date of Patent: Feb. 26, 1991

[54] ROLL-INDEPENDENT MAGNETO METER SYSTEM

[75] Inventor: Brian W. Daniels, Weymouth, England

[73] Assignee: The Secretary of State for Defence in her Britannic Majesty's Government of the United Kingdom of Great Britain and Northern Ireland, London, England

[21] Appl. No.: 416,238

[22] Filed: Sep. 29, 1989

Related U.S. Application Data

[62] Continuation of PCT GB88/00249 Filed Mar. 31, 1988.

[30] Foreign Application Priority Data

Apr. 14, 1987 [GB] United Kingdom ........... 8708953
Nov. 3, 1987 [GB] United Kingdom ........... 8725715

[51] Int. Cl.$^5$ .................................... G01R 33/04
[52] U.S. Cl. .............................. 33/361; 33/355 R; 324/244; 324/246; 324/247; 324/254; 324/253
[58] Field of Search ............... 33/361, 362, 355 R, 33/352; 324/247, 245, 244, 258, 254, 253, 257, 246

[56] References Cited

U.S. PATENT DOCUMENTS

| 3,628,254 | 12/1971 | Burmeister | 33/225 |
|---|---|---|---|
| 3,800,213 | 3/1974 | Rorden | 324/247 |
| 3,936,949 | 2/1976 | Devaud | 33/352 |
| 4,116,057 | 9/1978 | Sullivan | 324/246 |
| 4,277,751 | 7/1981 | Lawson et al. | 324/247 |
| 4,462,165 | 7/1984 | Lewis | 324/361 |
| 4,475,078 | 10/1984 | Itani | 324/254 |
| 4,692,703 | 9/1987 | Extance et al. | 324/254 |

FOREIGN PATENT DOCUMENTS 3224633 2/1982 Fed. Rep. of Germany .
0108981 5/1986 Japan ........................ 324/247
0943615 7/1982 U.S.S.R. ..................... 324/244

OTHER PUBLICATIONS

S. C. Ling, Journal of Spacecraft, "Fluxgate Magnetometer for Space Application", vol. 1, No. 2, Mar.-Apr. 1964, pp. 175–180.
Space Science Instrumentation, vol. 1, No. 2, 1975, D. Reidel Publishing Co. (Dordrecht, NL), M. H. Acuna et al., "The Pioneer XI High Field Fluxgate Magnetometer", pp. 177–188.
Revue de Physique Appliquee, vol. 5, No. 1, Feb. 1970 (Paris, FR), D. I. Gordon et al., "Low Field Magnetometer Sensor of High Stability", pp. 175–177.
IEEE Transactions on Geoscience Electronics, vol. GE-7, No. 4, Oct. 1969, (New York, U.S.), M. H. Acuna et al., "A Miniature Two-Axis Fluxgate Magnetometer", pp. 252–260.
International Search Report.

Primary Examiner—William A. Cuchlinski, Jr.
Assistant Examiner—William C. Dowling
Attorney, Agent, or Firm—Nixon & Vanderhye

[57] ABSTRACT

A roll-independent magnetometer which may be used for example in a towed array magnetometer system comprises a first magnetic field sensor having iso-angular flux sensitivity about a roll axis and a second magnetic field sensor having sensitivity along the roll axis, the arrangement being such that a component of a magnetic field along the roll axis is measured by the second unidirectional sensor and the component of the field lateral to the roll axis is measured by the first sensor. Corrections may be applied for the inclination of the sensor and the angle of dip of the Earth's field. The angle of dip may be measured either in the towing vessel, in the towed body, or provided in look-up tabulated form.

13 Claims, 6 Drawing Sheets a.) CONDITION FOR ZERO INFLUENCING FIELD
SHOWING A=-B.

a.) CONDITION FOR ZERO INFLUENCING FIELD
SHOWING A=-B.

b.) CONDITION FOR A/B OFFSET DUE TO INFLUENCING
FIELD SHOWING FLUX IN A>B.

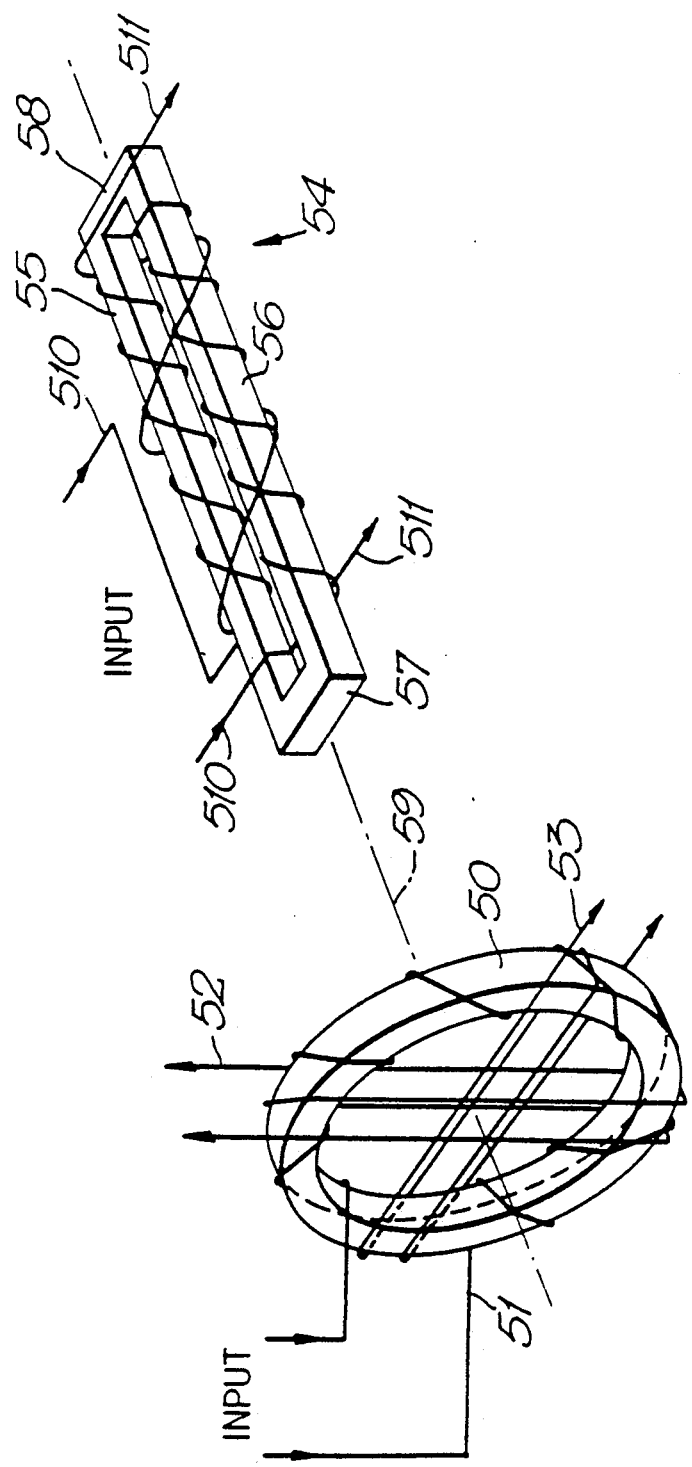

ROLL-INDEPENDENT MAGNETO METER SYSTEM

This application is a continuing application under 35 USC 363 of International Application No. PCT/GB88/00249 filed Mar. 31, 1988.

The invention relates to magnetometer systems for heading measurements and in particular to a system which is independent of orientation about one axis.

For underwater situations typical present practical devices use gimballed compasses providing heading information from serially encoded azimuth measurements. In many applications lightness and reliability are requirements. Reliability can be improved by eliminating moving parts. In order to dispense with gimbal bearings it is necessary to provide an attitude sensing device to correct the measured magnetic vector for conditions of the magnetic sensor other than heading changes. One approach to the measurement of magnetometer attitude has been to use sensitive accelerometers. This has proved troublesome in respect of long term drift and inability to withstand wave-induced shock conditions.

The object of the present invention is to provide a roll-independent magnetometer system minimising the reliance on moving parts.

The invention provides a roll-independent magnetometer system comprising two magnetic field sensors, characterised in that there is provided a first magnetic field sensor mountable on a movable object and arranged to have iso-angular flux sensitivity about a roll axis and a second magnetic field sensor mountable on the object and arranged to have sensitivity along the roll axis; the arrangement being such that a component of a magnetic field along the roll axis is measured by the second unidirectional sensor and the component of the magnetic field lateral to the roll axis is measured by the first sensor.

Advantageously the sensors comprise toroidal magnetic cores; preferably the first sensor is a regular toroid having symmetry about an axis perpendicular to the plane of the toroid and mountable on the object such that its axis is parallel to the roll axis of the object, and preferably the second sensor is an elongate magnetic body having a large length to width ratio, arrangeable lengthwise of the roll axis of the object and dimensioned to enable and/or simplify accurate spatial colocation with the toroid. In the preferred arrangement the first sensor is provided with a uniform primary toroidal winding for connection to a source of an alternating energising signal and one or more pairs of mutually perpendicular secondary pick-off coils encirling the toroid. Alternatively, additional toroids each with one set of orthogonal coils can be 'ganged' each displaced such that all the axial angular data are at equal angles with respect to adjacent toroids. The second sensor is placed lengthwise of the roll axis and is provided with a primary coil for connection to a source of an energising alternating signal and a secondary pick-off coil encircling the magnetic body and having an axis parallel to the roll axis. Preferably the two primary coils are connected to the same source of alternating current. In the preferred arrangement the pick-off coils of the first and second sensors are connected to respective circuits selectively responsive to the second harmonic of the primary energising signals. Preferably these circuits include phase sensitive detectors. The detected signals from the orthogonal pick-off coils of the first sensor are connected to a processing circuit wherein the lateral component of an external field is derived from the square root of the sum of the squares of the said detected signals. Advantageously there is included a store programmed with a calibrated look-up table of headings such that the calculated headings derived from the ratio of the longitudinal to lateral fields can be corrected for any nonlinearity; likewise for orthogonal error correction to the toroid output.

Preferably there is included means to measure the relative angle of inclination of the roll axis of the magnetometer system to the Earth's field such that the heading derived from the look-up table can be corrected for inaccuracies due to dip angle. The measuring means may include an inclinometer to measure the inclination to the horizontal of the magnetometer.

In an alternative arrangement the longitudinal component of the external field may be measured by providing a wire of mumetal or other suitable material parallel to the roll axis and transmitting an alternating current, a pick-off winding provided around the mumetal wire, a DC bias source connected to the mumetal wire and an AC detector connected to the pick-off coil, the arrangement being such that the field is determined from the DC bias required to cancel the effect of the field. The invention will now be described by way of example only with reference to the accompanying drawings of which:

FIG. 5 shows a magnetometer system according to the invention;

Figure 1:
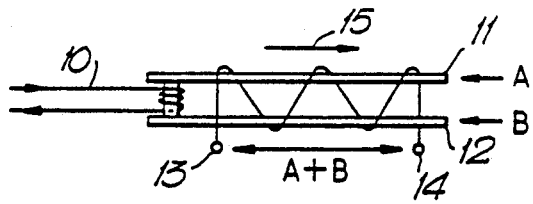
FIG. 1 illustrates a known magnetometer.
Figure 2:
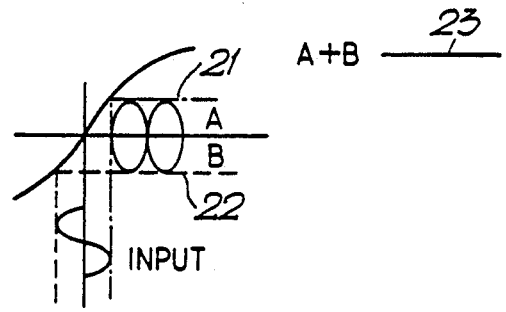
FIGS. 2 and 3 show the change in response of the magnetometer to a sinusoidal energising signal when an external magnetic field is present.
Figure 3:
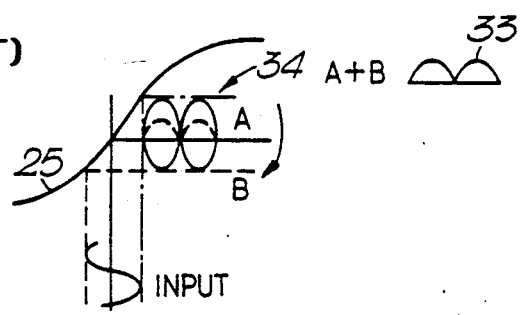

The principle of operation of a known magnetometer is illustrated with reference to FIGS. 1 to 4. The basic function of a magnetometer is to detect the presence of a static magnetic field which induces flux into a stationery high permeability device. This static flux serves to modify the B/H curve operating mode of the magnetic material in such a way as to cause a magnetic imbalance when energised from a reference magneto-motive force. An energising signal is coupled to a magnetic circuit via an input coil 10. The magnetic circuit includes two spaced ferro-magnetic pole elements 11, 12 connected at one end by a further ferro-magnetic element about which the coil 10 is placed. An output coil 13-14 encircles the pole elements 11, 12 and the current induced in this coil is used to determine an external magnetic field 15. When the influencing external magnetic field 15 is zero a sinusoidal energising input signal 20 applied to the input coil 10 induces similar magnetic fields A(21) and B(22) of opposite phase in the magnetic elements 11 and 12 which result in a zero current A+B(23) induced in the output coil 14. In the presence of an influencing external magnetic field 15, however, when the pole elements 11, 12 have asymmetrical flux relationships, the operating point (34) on the B-H characteristic 25 changes and the resulting signal 33 in the output coil 14 is of the form:

$$k - a \cos 2n - b \cos 4n - c \cos 6n - \quad (1)$$

where K, a, b ... are constant and n is the frequency of the input signal. The amplitude of this signal will depend on the magnitude of the influencing field.

Figure 4:
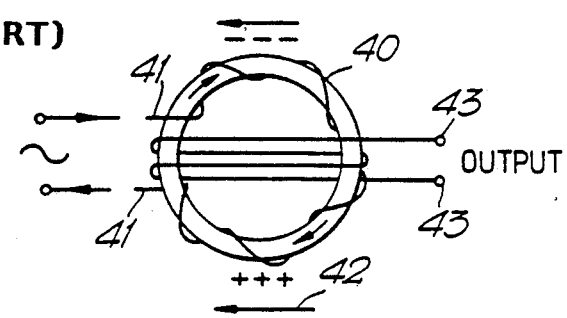
FIG. 4 shows a known toroidal magnetometer.

A similar effect is obtained when a toroidal winding 40 is energised by an alternating signal at the input 41 and subjected to a static ambient magnetic flux 42 as shown in FIG. 4. The plus and minus signs indicate the flux imbalance due to the presence of the static field 42. This results in an asymmetrical flux which produces a signal at the output 43 containing even harmonics (equation (1)). Current flux gate magnetometers exploit this feature, using a horizontally disposed toroid with orthogonal solenoidal pick off coils to derive X-Y azimuthal coordinates. Various signal processing techniques are used but the most common is to use a band pass filter to extract the second harmonic signals and perform a tan-1 function on the two signals.

This conventional flux gate magnetometer is flux sensitive in all three rectangular coordinate axes and to be suitable for towed module applications it would be necessary to apply attitude compensation in order to avoid using a gimballed construction.

FIG. 5 shows a magnetometer system according to the invention. The arrangement is such that it has a longitudinal axis which can be made parallel to the roll axis of a towed module such that the magnetometer is insensitive to roll while changes of angle of elevation can be compensated by a simple correction factor. A ferrite toroid 50, vertically disposed, is provided with an energising input coil 51 helically wound around the toroid. Mutually perpendicular "X" and "Y" pick off coils 52 and 53 encompass the toroid. Coaxially aligned with the toroid 50 is a magnetic field probe 54. The probe 54 comprises an elongated toroid forming a rectangular body with side members 55, 56 of much greater length than the end members 57, 58. The probe 54 is disposed such that the longitudinal axis of symmetry of the probe 54 is colinear with the axis 59 of the toroid 50, A primary input coil 510 is sequentially wound around the side arms 55, 56 of the probe 54 and a secondary pick-off coil 511 encompasses the probe.

Azimuthal angular measurements are affected by the inclination or angle of elevation of the magnetometer from the horizontal as well as by the local angle of the magnetic field to the horizontal—the angle of the dip. Given the relative angle of the device to the magnetic field to be $\phi$, then the true angle $\theta$ will be affected by the change in flux in the toroid and probe due to $\phi$.

With the toroid 50 mounted vertically the sum of the squares of the signals from the solenoidal coils 52 and 53 will be a constant for all angles of roll about the axis 59.

The orthogonal outputs x, y from coils 52, 53 will be preserved in complex notation in order to preserve the signs of the respective angles and in the case of one coil set:

$$\text{let } x = \sin \theta \sin \alpha \quad (2)$$

$$y = \cos \theta \sin \alpha$$

where $\theta$ is the roll axis angle and $\alpha$ is the azimuthal angle.

$$\text{Then } \sqrt{x^2 + y^2} = \sin \alpha \quad (3)$$

Thus the root sum of the squares of the outputs of the two coils is dependent on the azimuthal angle. In this mode of operation of the toroid 50 the second harmonic of the composite output is a function of its azimuthal position and the output is independent of the roll axis attitude.

The toroid 50 thus produces an output corresponding to the lateral component of to the magnetic heading vector. The longitudinal component is derived from the probe 54 aligned with the roll axis 59.

Figure 6A:
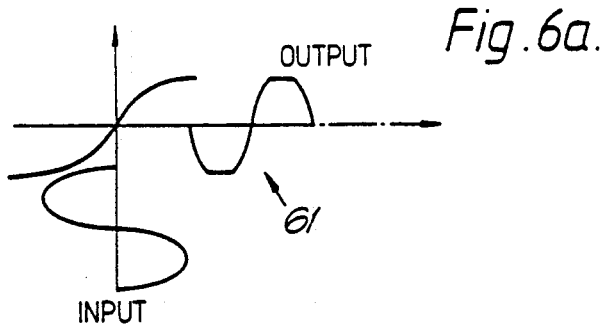
FIGS. 6a and 6b show the FIG. 5 magnetometer system response curve illustrating one mode of operation.
Figure 6B:
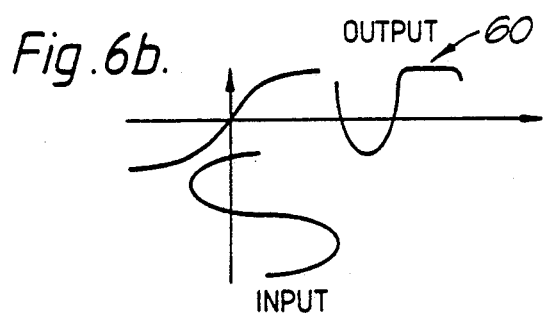

Various methods of signal processing are possible, however, the method chosen is to operate the device with the magnetic cores driven into saturation as shown in FIG. 6a. An offset magnetic field distorts the output 60 (FIG. 6b) as compared with the output 61 with no offset field. Second harmonic components are then detected using a phase-sensitive detection process as will be described below.

Figure 7:
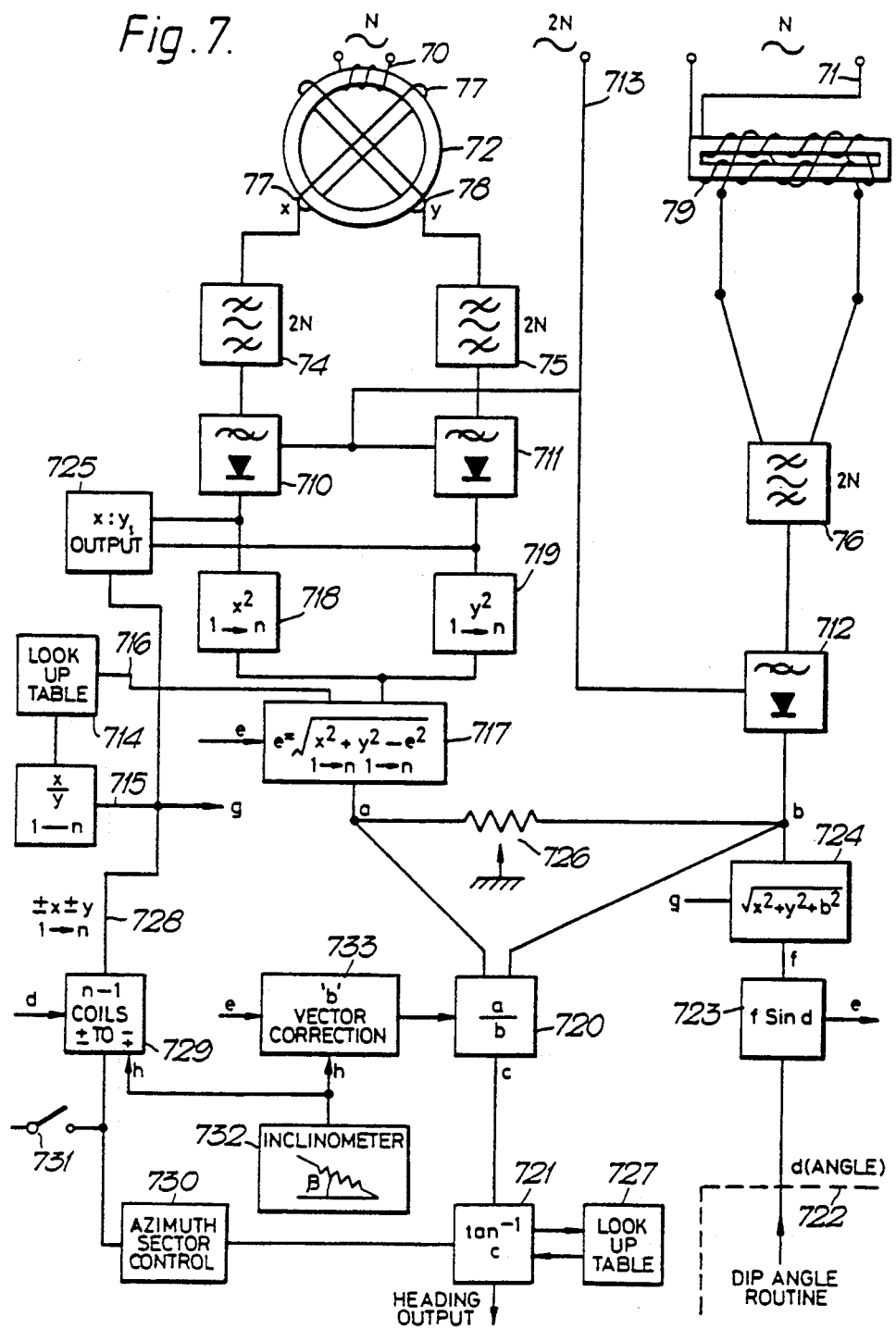
FIG. 7 is a block diagram of the FIG. 5 magnetometer system signal processor.

FIG. 7 illustrates a detailed method of deriving heading information. Energising signals of frequency N from a frequency source (not shown) are applied to the respective X,Y coils 70 and 71 of the toroid 72 and probe 73. For convenience only 1 set of orthogonal X,Y coils are shown although accuracy of measurement will be improved by using more than one set (n). Bandpass filters 74-76 pass the second harmonic components of frequency 2N from the X, Y and probe pick-off coils 77, 78 and 79 respectively. The filtered signals are connected to respective phase sensitive detectors 710-712 to which a reference frequency 2N is also connected. The reference frequency 2N from the energising signal source is also connected to the phase sensitive detectors 710-712 via common input 713. A look-up table (714) may be provided to monitor the X, Y outputs of the n coil sets and regulate for orthogonal errors of the toroid's solenoidal coils. Typically the tangent of the roll angle would be monitored by taking X/Y values via 715 updating and applying necessary correction factors via channel 716 to the sum square values of the X, Y outputs which is derived in circuit 717. This would be achieved by mapping the X/Y values against a corresponding array of factors derived during calibration. These factors would comprise true sum squares ratioed with actual measured sum squares for each minimum resolvable roll angle. The inverse of these factors would thus constitute the factors used to correct the executive sum square calculations.

For each set of coils 1 to n the outputs from the X and Y phase sensitive detectors 710, 711 are squared in respective circuits 718, 719 and then the modulus of the complex amplitude $a (=\sqrt{x^2+y^2-e^2})$ is derived in the circuit 717, where e is a correction derived from the measured angle of dip as will be described. For a system involving more than one set of orthogonal coils the modulus of the complex amplitude will be:

$$a = \sqrt{x_1^2 + y_1^2 + x_2^2 + y_2^2 \ldots x_n^2 + y_n^2} \quad (4)$$

for 'n' sets of pick off coils. The output a from the circuit 717 together with the output b from the probe phase sensitive detector 712 are ratioed (720) to give an output signal c(=a/b). The vector 'b' is corrected (733), as will be described later, in dependence on the dip angle correction signal e and the instrument inclination angle β measured by an inclinometer 732. The output signal c is then processed (721), subject to corrections to be described, to give a heading output $\tan^{-1} c$. The measured value of the inclination angle d obtained by electrical measurement (722) of the relative angle ξ of the magnetometer roll axis to the Earth's field is processed (723) to give a dip correction signal e equal to f sin d. f is the output from a further circuit 724 and is equal to $\sqrt{x^2+y^2+b^2}$ where x and y are derived from the output g from an output unit 725 connected to the x,y phase sensitive detectors 710, 711.

Figure 8:
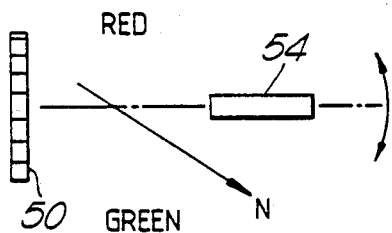
FIGS. 8 and 9 show the FIG. 5 magnetometer in plan and side elevation to illustrate the current phase monitoring scheme used to provide correct bearing readings through 360°.
Figure 9:
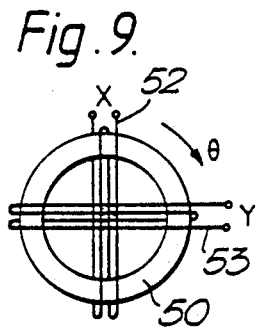

A normalisation resistor 726 with an adjustable earth tap or equivalent technique is provided for calibration of the probe and toroid performance. To account for any non-linearity a PROM look-up table 727 is provided to correct the heading values c. Because the toroidal element 72 is free to rotate in roll as well as being subject to azimuthal slew it is necessary to provide East/West discrimination depending on the roll direction from normal. This can be achieved by locating and monitoring the phase of the solenoidal X, Y coils obtained from the output (725) from the X,Y phase sensitive detectors 710 and 711. Thus the toroidal outputs also provides an input channel 728 providing magnitude and sign of X and Y to a polarity control sensing store 729. The sign convention for phase monitoring and the use of the information in the store 729 by an azimuth sector control 730 to remove East/West azimuthal ambiguity and correct the heading computation (721) is illustrated in FIGS. 8 and 9, the example being for 1 pair of X/Y coils. Azimuth angles are designated green or red depending upon whether they are east or west of north. The roll axis angle θ is measured from the plane of the "X" pick-off coil 52, with X=+ve as θ lies between 0° and 90° and Y −ve as θ lies between 90° and 180°. The sign table is therefore:

| Quadrant | Green | | Red | | Sign of tan θ (y/x) | |
|---|---|---|---|---|---|---|
| θ° | x | y | x | y | Green | Red |
| 0-90° | + | − | − | + | − | − |
| 90-180° | − | − | + | + | + | + |
| 180-270° | − | + | + | − | − | − |
| 270-360° | + | + | − | − | + | + |

The logic therefore is:
a. When the phase of both x and y reverses during a progressive azimuth change then the azimuthal angle measured will fall in the opposite 180° sector.
b. When the tan θ sign changes a roll displacement has occurred and the magnitude and phase are located in the store for future comparison.
c. The risk of error due to the near simultaneous occurrence of roll and azimuth transfer to the opposite 180° sector can be eliminated by an additional set of coils as described. Under these conditions the only electrical condition for azimuth transfer is where a minimum of n−1 coils see a reversal of field polarity. (Where n=No of coils). Angle of dip correction is preferred prior to phase monitoring.

Thus the data channel 728 carries the phase information of the toroid outputs. In the store 729 an algorithm interrogates both toroid outputs every time any phase reversal takes place such that, in accordance with the logic table, a sector transfer is implemented under the pre-defined logic conditions. The azimuth sector control 730 then transfers the heading reading, port or starboard with respect to the longitudinal axis to the heading processor 721. Thus by looking for polarity reversals in one or more of the toroidal coils the sensor is able to discriminate between east and west sectors. For angles of dip other than zero, phase shifts occur in the x/y coils such that reversals are delayed or a permanent offset in output is sensed. The x/y vector amplitudes can be corrected such that compensation is achieved equivalent to zero angle of dip. The sector control is corrected for angle of dip by connecting dip angle signal d together with an inclination signal h from an inclinometer 732 to the store 729. This provides vector correction to the x/y outputs of the toroid to simulate a zero angle of dip situation.

On setting up the magnetometer (at time t=o) a sector set up switch 731 connected to the store 729 and azimuth sector control 730 is operated such that the X and Y coil current parameters are stored in a random access memory of the store 729 with the magnetometer axis 59 typically in a NW direction. Thereafter the coil current parameters are updated providing a real time record of the roll position of the toroid.

An alternative approach is to provide a East/West transposition such that on switch on the correct sector can be selected appropriately.

In practice system integration may require allowance for minor inaccuracies of the probe/toroid relative position and so a probe 'sin max' threshold condition would be incorporated into the algorithm for the section transfer routine.

Alternative methods for processing the current parameters may be used: a magnetic system may be used as a magnetic amplifier, and not driven into saturation as shown in FIG. 6. This provides gain but would be unidirectional unless a controlled bias signal could be applied to the toroidal core. It would also be possible to quantify the flux dwell time per half cycle and correlate with a reference signal after clipping and differentiation.

Figure 10:
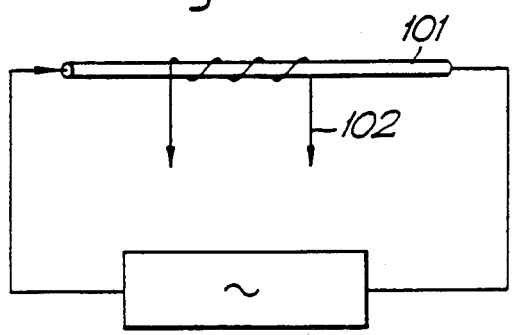
FIG. 10 shows an alternative magnetic field probe for use in the FIG. 5 arrangement.

The unidirectional magnetic field probe 54 may be replaced by the arrangement shown in FIG. 10. The alternating current source is connected across a wire of mumetal or other suitable magnetic material 101 disposed parallel to the roll axis 59. A pick-off coil 102 is wound around the wire 101. The component of an external magnetic field parallel to the wire 101 is determined by measuring the level of a DC bias signal applied to the wire 101 to cancel the alternating signal induced in the pick-up coil 102. This method would require correction for variation of the earth's magnetic flux density with global position. In a further variation the orthogonal X, Y coils on the toroid may be tuned to a frequency of 2N prior to phase sensitive detection.

In an alternative arrangement, simultaneous compensation may be made for sensor inclination and variation in the angle of dip of the Earth's magnetic field.

The angle of dip $\phi$ is the angle from the horizontal of the Earth's magnetic field vector. The magnetic heading error will be a function of the effect of the angle of dip on the toroid and probe outputs as will be shown. When the device is placed in the influence of an oblique magnetic field a component proportional to the sine of the magnetic vector angle to the horizontal is included in the toroid root sum square output. Additionally, the probe output is reduced in a manner proportional to the cosine of this magnetic vector angle.

Thus angle of dip corrections are needed to obtain the correct heading $\theta$.

Figure 11:
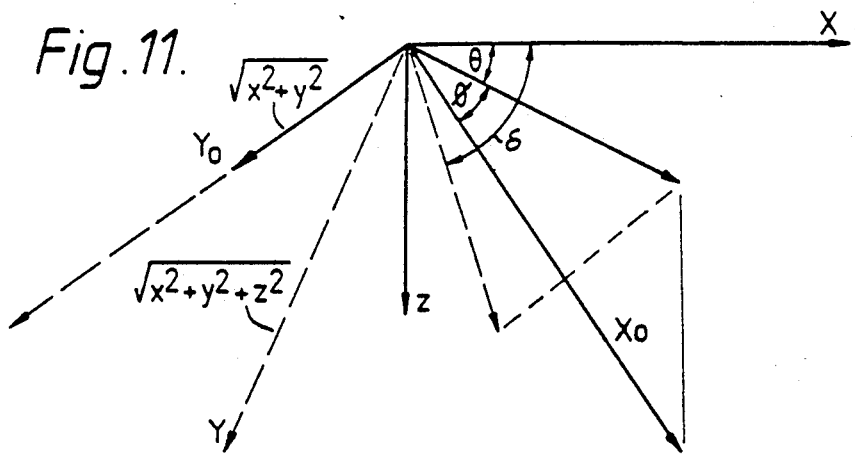
FIGS. 11-13 show the magnetometer system of FIG. 5 to illustrate the effect on heading measurements of the angle of dip of the Earth's magnetic field.

The magnetometer vector relationships are shown in FIG. 11 from which let:

$$Y = \sqrt{x^2 + y^2 + z^2} = \sin\delta \quad (5)$$

heading at dip angle $\phi$ $$X = \text{(probe output)} = \cos\delta$$

For true heading at dip angle $\phi$ $$Y_o = \sqrt{x^2 + y^2} = \sin\theta \quad (6)$$

where $\theta$ is the true heading.

Component 'z' is derived from the field strength as a function of $\sin\phi$ and appears as $X_o \sin\phi$ where $X_o$ is the magnetometer vector total at dip angle $\phi$. All the above relationships assume the outputs from the toroid and probe to be normalised at a known reference.

$\therefore$ True heading from longitudinal axis $$= \tan^{-1}\left[\frac{\text{True lateral horizontal coordinate}}{\text{True longitudinal horizontal coordinate}}\right] \quad (7)$$

$$= \tan^{-1}\frac{\sqrt{x^2 + y^2 - (X_o \sin\phi)^2}}{X}$$

or $$= \cos^{-1}\frac{X}{\sqrt{x^2 + y^2 + X^2} \cdot \cos\phi}$$

an alternative arrangement, as can also be seen from the FIG. 11 vector diagram.

Angle of dip correction is required to enable complete global cover. Such a correction can be obtained by using the root sum square output from the toroid and the probe.

The general expression for the output from the toroid and the probe at dip angle $\phi$ is $$Kn = \sqrt{Y^2 + (X_\phi \sin\phi)^2 + (X_\phi \cos\phi)^2} \quad (8)$$

where
$Y^2$ = toroid RSS x/y components only
$X_\phi$ = probe output at zero dip angle
At due N-S the Y term equates to zero and so the expression becomes:

$$Kn = \sqrt{Y_n^2 + X_n^2} \quad (9)$$

where $X_n = X_\phi \cos\phi$ and $Y_n = X_\phi \sin\phi$.

Angle of dip $\phi$ is therefore:

$$\cos^{-1}\frac{X_n}{\sqrt{Y_n^2 + X_n^2}} \text{ as obtained at due } N - S. \quad (10)$$

To enable the arc $\cos\phi$ function to be obtained a North/South datum is required at which point the value of $X_n/K_n$ is obtained where:

$K_n$ = root sum square of the toroid X/Y and probe outputs and $X_n$ = the probe.

This can be done by a concurrent maxima seeking probe and minima seeking toroid. A calibration update is then implemented when these conditions have been sensed.

Figure 12:
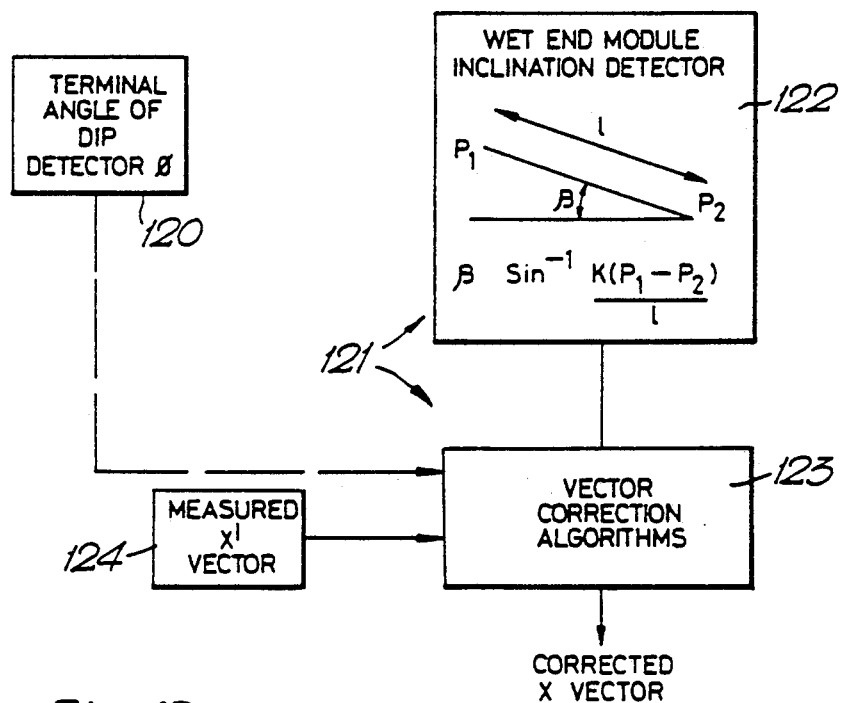
Figure 13:
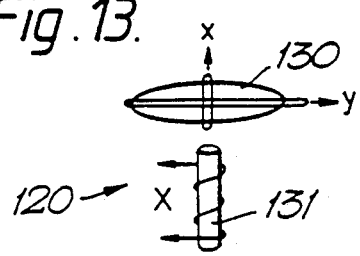

A North or South crossing is necessary to enable this to be done and this may be disadvantageous. An alternative is to use a device 120 at the towing ship which is not subjected to roll and is therefore easy to calibrate and process as shown in FIGS. 12 and 13. Angle of dip $\phi$ information is then transmitted from the ship to the towed module device 121. The ship's device unit 120 angle of dip $\phi$ detector could consist of a toroid 130 and probe 131 displaced such that the probe 131 is vertical. In this situation the angle of dip $= \sin^{-1}(X_n/K_n)$ where $$X_n/K_n = \frac{X}{\sqrt{Y^2 + X^2}}$$

where
$Y^2$ = toroid sum square output
$X^2$ = probe squared output

Compensation can be made in the towed module 121 for the effects of inclination $\theta$ of the module by a simple differential hydrostatic pressure detector 122, as an example only.

Figure 14:
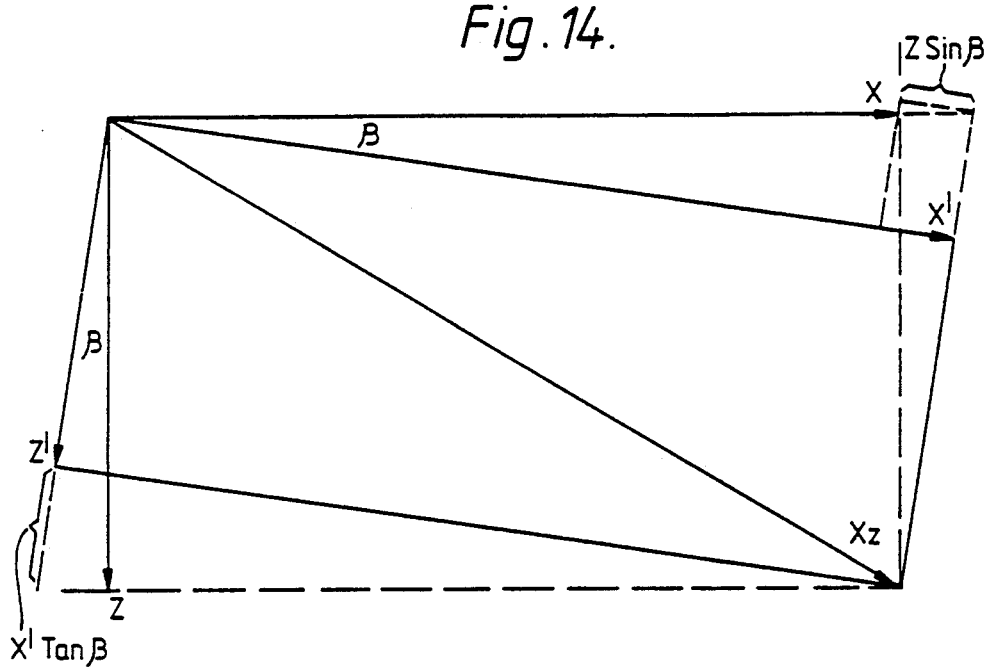
FIG. 14 is a vector diagram showing the effect of inclination on the X vector.

The inclination of the module 121 to the horizontal is given by Arc Sin $[k(P1-P2)/1]$ where $P1-P2$ is the differential pressure measured at separation 1. Vector correction 123 is then applied to the measured X' component 124 by virtue of the relationship:

$$X = \frac{X' - Z\sin\beta}{\cos\beta}$$

from FIG. 14 where X = true longitudinal component, X' the measured value at angle $\beta$ and $Z = X_o \sin\phi$ [from previous equation 7].

An alternative to this method is to use a PROM lookup table for various angles of dip and integrate with the transportation vessel's navigational system to enable local dip angle update.

Figure 15:
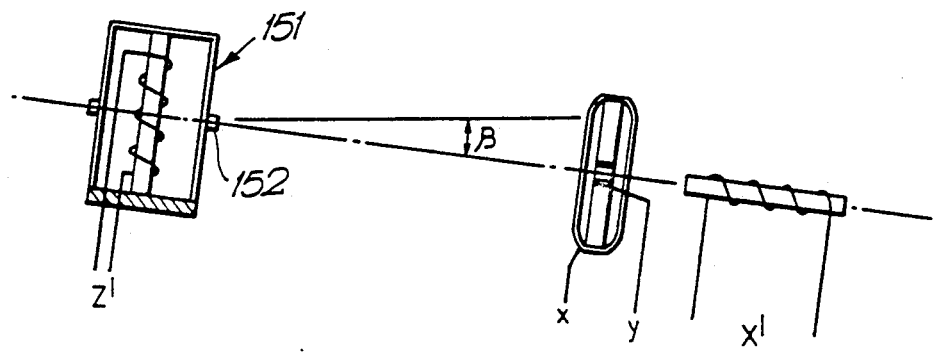
FIG. 15 shows an arrangement using a tilting reference magnetometer for heading measurement corrected for inclination.

As an alternative it is possible to use an outboard [wet end] reference magnetometer 151 as shown in FIG. 15 with one degree of freedom in roll (about axis 152) to give a vertical reference in the Y/Z plane in which case the device will incline from the horizontal with the measuring magnetometer. This will enable the 'Z' component at angle $\beta$ to be directly measured and hence the true value of X computed. By this arrangement the processing circuit 723 is not required since e is then the measured Z component under these conditions:

$$X = \frac{X^1}{\cos\beta}(1 - \sin^2\beta) - Z^1\sin\beta$$

where $Z^1$ is the measured 'Z' component.

Other types of magnetometer may be used in place of those described. These will be apparent to those skilled in the art.

I claim:

1. A roll-independent magnetometer system comprising two magnetic field sensors, said system comprising:
    a first magnetic field sensor mountable on a moveable object and arranged to have iso-angular flux sensitivity about a roll axis; and
    a second magnetic field sensor mountable on the object and arranged to have sensitivity along the roll axis wherein said second sensor is an elongate toroidal magnetic body having a large length to width ration, arrangeable lengthwise of the roll axis of the object and dimensioned to permit accurate spatial colocation with the first sensor, said second sensor is provided with a primary coil for connection to a source of an energizing alternating signal and a secondary pick-off coil encircling the magnetic body and having an axis parallel to the roll axis;
    the arrangement being such that a component of a magnetic field along the roll axis is measured by the second unidirectional sensor and the component of the magnetic field lateral to the roll axis is measured by the first sensor.

2. A magnetometer system as claimed in claim 1 characterized in that the first sensor is a magnetic body of generally regular toroidal form having symmetry about an axis perpendicular to the plane of the toroid and mountable on the object such that its axis is parallel to the roll axis of the object.

3. A magnetometer system as claimed in claim 1 characterized in that the first sensor is provided with a uniform primary toroidal winding for connection to a source of an alternating energizing signal and one or more pairs of mutually perpendicular secondary pick-off coils encircling the toriod.

4. A magnetometer system as claimed in claim 3 characterized in that the primary coils of the first and second sensors are connected to the same source of alternating current.

5. A magnetometer system as claimed in claim 4 characterized in that the pick-off coils of the first and second sensors are connected to respective circuits selectively responsive to the second harmonic of the primary energizing signals.

6. A magnetometer system as claimed in claim 5 wherein the second harmonic circuits include phase sensitive detectors.

7. A magnetometer system as claimed in claim 6 characterized in that the detected signals from the orthogonal pick-off coils of the first sensor are connected to a processing circuit wherein the lateral component of an external field is derived from the square root of the sum of the squares of the said detected signals.

8. A magnetometer system as claimed in claim 1 characterized in that there is included at least one store programmed with a calibrated look-up table such that the calculated headings derived from the ratio of the longitudinal to lateral or other ratioed components of field can be corrected for any nonlinearity and also for toroidal output orthogonal error.

9. A magnetometer system as claimed in claim 8 characterized in that there is included means to measure or derive from stored data the relative angle of inclination of the roll axis of the magnetometer system to the Earth's field such that the heading derived from the look-up table can be corrected for inaccuracies due to dip angle.

10. A magnetometer system as claimed in claim 9 characterized in that the measuring means includes an inclinometer to measure the inclination to the horizontal of the magnetometer and means connected thereto to correct the magnetometer measurements.

11. A magnetometer system as claimed in claim 10 characterized in that an auxilliary reference magnetometer is included as a means of angle of dip correction in conjunction with the inclinometer.

12. A magnetometer system as claimed in claim 11 characterized in that the reference magnetometer is supported so as to have one degree of freedom about the roll axis of the magnetometer system.

13. A roll-independent magnetometer system comprising two magnetic field sensors, said system comprising:
    a first magnetic field sensor mountable on a moveable object and arranged to have iso-angular flux sensitivity about a roll axis; and
    a second magnetic field sensor mountable on the object and arranged to have sensitivity along the roll axis; the arrangement being such that a component of a magnetic field along the roll axis is measured by the second unidirectional sensor and the component of the magnetic field lateral to the roll axis is measured by the first sensor, wherein the longitudinal component of the external field is measured by providing one of a mumetal wire and other material, parallel to the roll axis and transmitting an alternating current, a pick-off winding provided around the mumetal wire, a DC bias source connected to the mumetal wire and an AC detector connected to the pick-off coil, the arrangement being such that the field is determined from the DC bias required to cancel the effect of the field.

* * * * *